US 6,710,636 B1

(12) United States Patent
Gibbs et al.

(10) Patent No.: US 6,710,636 B1
(45) Date of Patent: Mar. 23, 2004

(54) METHOD AND SYSTEM FOR HIGH RESOLUTION DELAY LOCK LOOP

(75) Inventors: Gary Gibbs, San Jose, CA (US); Lingsong Xu, Newark, CA (US); Sanjay Sancheti, Starkville, MS (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/264,692

(22) Filed: Oct. 3, 2002

(51) Int. Cl.[7] ................................................ H03L 7/06
(52) U.S. Cl. ........................................ 327/158; 327/161
(58) Field of Search ................................. 327/156, 158, 327/161

(56) References Cited

U.S. PATENT DOCUMENTS

| 5,550,514 | A | * | 8/1996 | Liedberg | .................... 331/1 A |
| 5,994,938 | A | * | 11/1999 | Lesmeister | .................. 327/277 |
| 6,100,733 | A | * | 8/2000 | Dortu et al. | ................. 327/149 |
| 6,239,626 | B1 | * | 5/2001 | Chesavage | .................... 327/99 |
| 6,486,716 | B1 | * | 11/2002 | Minami et al. | ............. 327/152 |

* cited by examiner

Primary Examiner—Terry D. Cunningham
Assistant Examiner—Quan Tra
(74) Attorney, Agent, or Firm—Wagner, Murabito & Hao LLP

(57) ABSTRACT

A method for utilizing a delay lock loop to cover a wide delay range. In one method embodiment, the present invention receives a reference clock pulse. Next, in a first loop, a phase variation is adjusted between the feedback clock pulse and the reference clock pulse utilizing a coarse delay in conjunction with a first fine delay. The resulting pulse is then output to a chip delay and then sent back to the delay lock loop as a feedback clock pulse. Additionally, in a second loop, the phase variation is adjusted between said second loop and said first loop utilizing the coarse delay in conjunction with a second fine delay, wherein the second fine delay has a delay range for adjusting the phase variation which overlaps the delay range of the first fine delay of the first loop.

20 Claims, 4 Drawing Sheets (BACKGROUND)

METHOD AND SYSTEM FOR HIGH RESOLUTION DELAY LOCK LOOP

FIELD OF THE INVENTION

The present invention relates to the field of reference clock signals. Specifically, the present invention relates to a high-resolution delay lock loop.

BACKGROUND ART

Presently, in order to maintain an efficiently operating computing system, a reference clock is utilized. In general, the reference clock is an internal timing device. Using a quartz crystal, the clock breathes life into the computing system by feeding it a constant flow of pulses. For example, a 200 MHz computing system receives 200 million pulses per second. The quartz crystal generates continuous waves, which are converted into digital pulses that are used as a signal to synchronize the operations within the electronic system. In most electronic cases, clock pulses are continuous, precisely spaced changes in voltage.

In order for all the components within the computing system to take advantage of the reference clock, the reference clock pulse is disseminated to each component within the computing system. Thus, each component is synchronized to a specific timing pattern and ordered computations may then take place. To take full advantage of the computational order within a computing system, as the clock pulse enters a specific circuit or group of circuits, a delay may be added. The delay may be used to ensure that one calculation or operation takes place before another. Additionally, the delay may be required in order for a specific component within a group of component to receive the results from another component within the same group of components.

However, once a component receives the reference clock pulse and adds a delay, the component must then return its results in phase with the original reference clock pulse. For example, a phase shift occurs if a delay is added when the reference pulse enters a component. A further delay can then be added to realign the outgoing phase with the original clock pulse. Thus, although a full 360-degree shift may have occurred within the component, the outgoing pulse is in phase with the original reference clock pulse. In many situations, the combined delay and phase alignment component are referred to as a delay lock loop (DLL).

FIG. 1 is an example of a conventional DLL. As shown in FIG. 1, the external clock pulse 101 enters the component 100 via input buffer 102. In general, input buffer 102 adds an initial delay to external clock pulse 101 due to the time required to drive the circuit. Therefore, the external clock pulse becomes a reference clock pulse 103. Reference clock pulse 103 then enters the programmable delay 104 which adds a specific delay to the already delayed reference clock pulse 103. Therefore, reference clock pulse 103 becomes an output clock pulse 105. Programmable delay 104 may be controlled by internal programming. The programmable delay is where a delay may be used to organize the order of a specific set of computations. Output clock pulse 105 then reaches the clock distribution 106 wherein it is then distributed to all places within the component or chip that it is needed.

The clock distribution 106 adds a further delay to output clock pulse 105. Upon distribution, output buffer 112 (which also maintains a delay in the output) is triggered. During the triggering of output buffer 112, output clock pulse 105 is passed through a second output buffer 122 which has the opposite value of output buffer 112 as well as an input buffer 118 which has a value opposite that of input buffer 102. Therefore, when the output clock pulse 105 reaches phase detector 108 it is now a feedback clock pulse 107. In general, both the delay due to input buffer 102 and output buffer 112 have been factored out of feedback clock pulse 107 due to the phase shifting calculations.

Phase detector 108 then detects the phase of the internal signal and tells controller 110 to add or subtract in order to regain the phase of the reference clock 103. Controller 110 then figures out how much to add or subtract in order to realign the phases of the feedback clock 107 with respect to the reference clock 103. Upon completion of the DLL circuit, the component is ready to output any resulting data 120 in a format which is in phase with external clock 101. As such, the output data 120 can easily be utilized by any other components working within the computing system on the same external clock.

When working correctly, the DLL will reduce most jitter (loss of phase synchronization) that occurs when the phase of the internal clock on output does not align with the reference clock. The reduction of jitter is accomplished by allowing the DLL to cover a range large enough to encompass most phase variations.

The problem with the DLL circuit 100 is that in order to maintain a consistent delay, which matches the reference clock phase with the least amount of jitter, there are two considerations to take into account. The first consideration is range and the second is accuracy. If the DLL is tuned for optimum range, then the accuracy will be sacrificed. Adversely, if the DLL is set for optimum accuracy, then the range is severely compromised.

If the accuracy is sacrificed, then the DLL will always maintain a certain amount of detrimental output jitter. Otherwise, if the range is compromised, then the DLL will reach a reset point more often. During a DLL reset, a large and possibly catastrophic jitter or skip may occur. In some situations, the jitter may cause complete shutdown of the system and require the user to manually reset the DLL.

SUMMARY OF INVENTION

A method for utilizing a delay lock loop to cover a wide delay range. In one method embodiment, the present invention receives a reference clock pulse and a feedback clock pulse. Next, in a first loop, a phase variation is adjusted between the feedback clock pulse and the reference clock pulse utilizing a coarse delay in conjunction with a first fine delay. The resulting pulse is then output to a chip delay and then sent back to the delay lock loop as a feedback clock pulse. Additionally, in a second loop, the phase variation is adjusted between said second loop and said first loop utilizing the coarse delay in conjunction with a second fine delay, wherein the second fine delay has a delay range for adjusting the phase variation which overlaps the delay range of the first fine delay of the first loop. Thus, when the phase variation moves beyond the delay range of the first fine delay of the first loop, it remains within the delay range of the second fine delay of the second loop.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Figure 1:
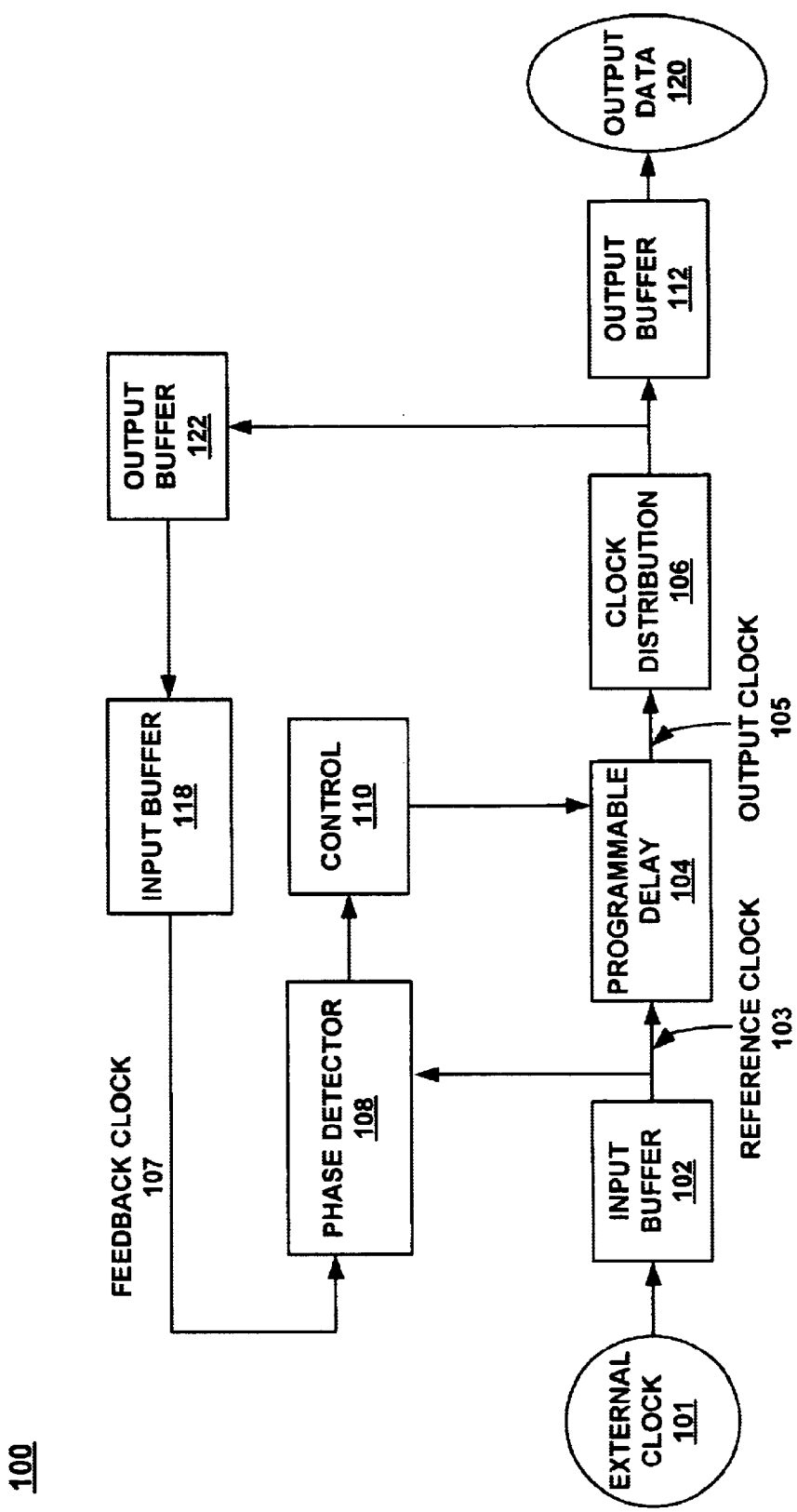
FIG. 1 is a block diagram of a conventional delay lock loop.

Reference will now be made in detail to embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail as not to unnecessarily obscure aspects of the present invention.

Some portions of the detailed descriptions which follow are presented in terms of procedures, logic blocks, processing, and other symbolic representations of operations on data bits within an electronic computing device and/or memory system. These descriptions and representations are the means used by those skilled in the data processing arts to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Usually, though not necessarily, these physical manipulations take the form of electrical or magnetic signals capable of being stored, transferred, combined, compared, and otherwise manipulated in a computer system or similar electronic computing device. For reasons of convenience, and with reference to common usage, these signals are referred to as bits, values, elements, symbols, characters, terms, numbers, or the like with reference to the present invention.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussions, it is understood that throughout discussions of the present invention, discussions utilizing terms such as "transmitting", "receiving", "offsetting", "creating", "storing", "delivering", "accessing", "generating", "providing", "adjusting", "outputting", "returning", "decompressing" or the like, refer to the action and processes of a computer system, or similar electronic computing device, that manipulates and transforms data. The data is represented as physical (electronic) quantities within the computing device's registers and memories and is transformed into other data similarly represented as physical quantities within the computing device's memories or registers or other such information storage, transmission, or display devices.

Figure 2:
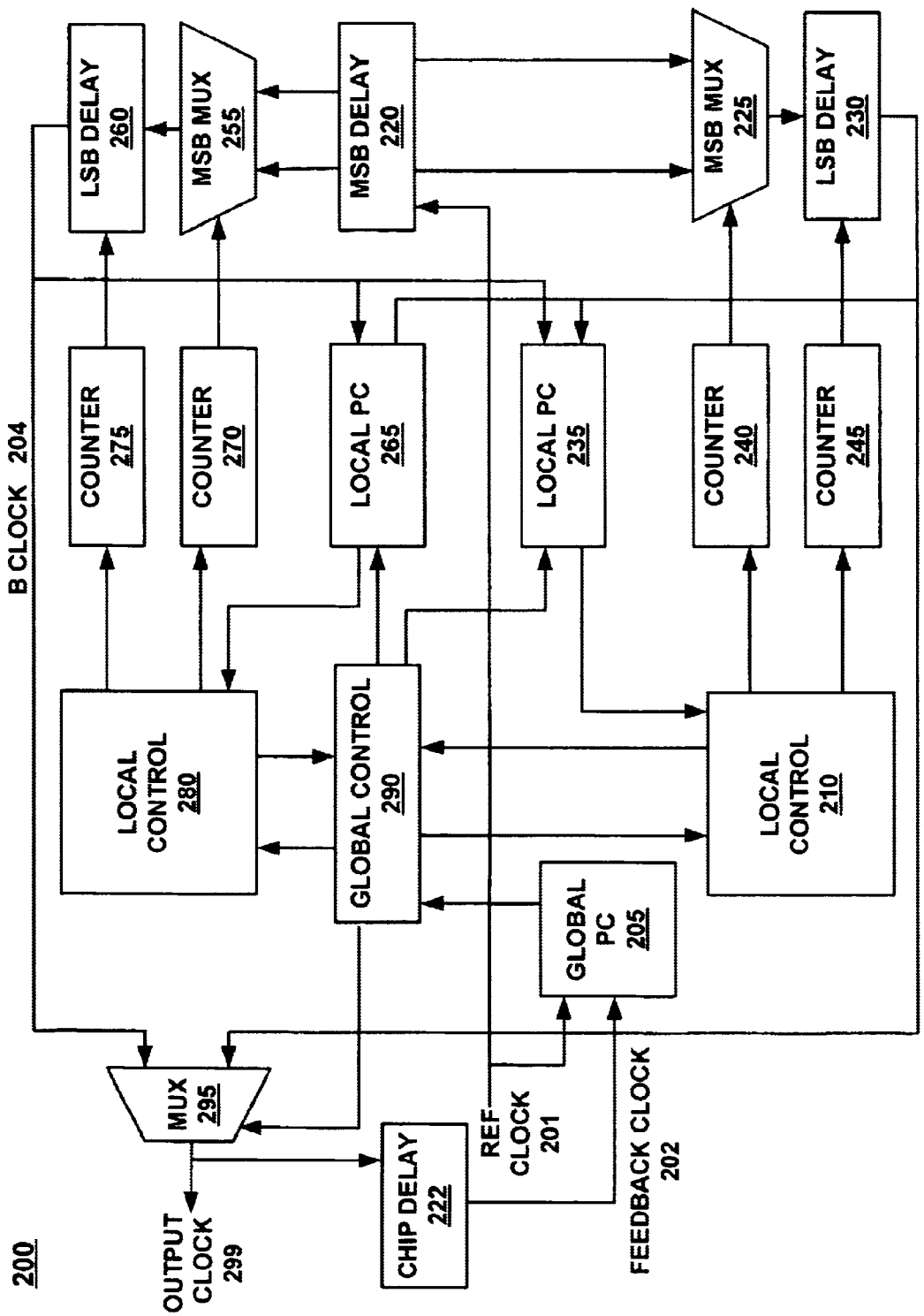
FIG. 2 is a block diagram of an exemplary delay lock loop in accordance with one embodiment of the present invention.

With reference now to FIG. 2, an exemplary delay lock loop (DLL) 200 is shown in accordance with one embodiment of the present invention. DLL 200 is comprised of a first programmable delay chain and a second programmable delay chain. One of these delay chains functions initially as a primary (or master) delay chain while the other functions initially as a secondary (or slave) chain. DLL 200, a master delay chain, is utilized to lock a global clock signal to maintain high resolution to reduce lock error, while using the slave delay chain to lock to the master for backup. The master and slave chains have overlapped delay control ranges so that, when operation-induced delay drifts out of the control range of the master delay chain, the system switches master and slave chains to maintain delay control with no major jitter. That is, the delay chain functioning as the master switches roles and begins functioning as the slave, while the delay chain functioning as the slave moves into the role of the master.

In general, DLL 200 is utilized to delay a clock pulse from reference clock 201. The purpose for delaying the clock pulse from reference clock 201 may be application dependent. That is, the delay may be based on an application's need for a delay. For example, an application may use a delay to perform a set of calculations in the correct operational order, or to allow the application time to receive data from a second application and/or calculation. Furthermore, the delay may result from environmental factors such as temperature changes, voltage changes, noise, input clock variations, or the like.

However, the delay is only the first portion of the operation of a DLL. In order for an application to correctly output any resulting data, the DLL must realign the phase of the offset clock pulse with that of reference clock 201. This realignment is desired in order that the output data that is carried by the electronic pulse is complete.

Referring still to FIG. 2, in one embodiment the master delay loop comprises a fine-tune adjustment capability which can resolve a phase variation between reference clock 201 and the delayed clock pulse (e.g., feedback clock 202 from chip delay 222) operating within DLL 200. For example, when reference clock 201 outputs a pulse that enters DLL 200, it is initially delayed by coarse (most significant bit (MSB)) delay element 220, controlled by global phase comparator (PC) 205, and/or global control 290. The master chain then utilizes local control 210, counters 240 and 245, MSB multiplexor (MUX) 225, and least significant bit (LSB) delay (first fine delay) 230, MUX 295, chip delay 222 to realign the phase of the feedback clock 202 with that of reference clock 201.

During the above stated delay lock loop, a second or slave chain (e.g., B clock 204) may also be in operation. The slave chain comprises a second fine tune adjustment capability (LSB) 260 which works to resolve the phase variation between B clock 204 with that of A clock 203 operating within DLL 200. For example, when a pulse from reference clock 201 enters DLL 200, it is initially delayed by the same coarse MSB delay element 220, controlled by global phase comparator (PC) 205, and/or global control 290 that delayed the pulse for the master chain. The slave chain further utilizes local control 280, counters 270 and 275, MSB MUX 255, and LSB delay (second fine delay) 260 to realign the phase of B clock 204 with that of A clock 203. Although the slave clock is stated herein as B clock 204, it is appreciated that the slave clock may be A clock 203. The initial loop labeling is done merely for purposes of clarity and brevity.

Once the delayed clock pulses are back in-phase (realigned), possibly after a phase shift of 360-degrees (or 720-degrees, 1080-degrees, etc.), the realigned clock pulse of the slave chain (e.g., B clock 204) is received at MUX 295 where it is stopped and not output. Therefore, the slave chain (e.g., B clock 204) acts as a back-up chain to the master chain (e.g., A clock 203), and the output of the slave chain (e.g., B clock 204) is not released outside of DLL 200, but remains within the local chain. However, a vital distinction between the slave chain (e.g., B clock 204) and the master chain (e.g., A clock 203) is that the slave chain (e.g., B clock 204) has an LSB delay 260 with a delay range that overlaps (or is offset from) the range of master LSB delay 230.

The overlap of slave LSB delay 260 is utilized when the operation-induced delay drifts out of the control range of the master chain (e.g., A clock 203). This can occur, for example, if the phase variation becomes too great for the master chain (e.g., A clock 203) to overcome without resetting itself to a new delay range. In this case, the slave chain (e.g., B clock 204) begins functioning as the master, and the master as the slave. Therefore, when a phase variation is too large for the master chain (e.g., A clock 203) to resolve without a reset, the slave chain (having a different control range than the master) may easily cover the phase variation without a reset. This is important since a reset in a DLL may cause a major jitter (resulting in a loss of data) to be output into the system. Therefore, the overlapping slave chain, without an accompanying major jitter in the output, is an extremely valuable device.

With reference still to FIG. 2, one embodiment of the operation of one cycle of a reference clock pulse is shown. Initially, a global control, such as a computer, utilizes a global clock, such as reference clock 201, to keep a system in an operational and organized mode. In the present embodiment, in order to keep the system operational, reference clock 201 utilizes an electronic pulse (actually, a series of pulses).

In general, each electronic pulse is received by DLL 200 and used to sequentially organize any operations and/or applications coupled with DLL 200. Upon access of DLL 200, a clock pulse is received by a global phase comparator (PC) 205. Global PC 205 compares the phase of the feed back clock 202 with reference clock 201 and returns its detected results to global control 290.

Figure 3A:
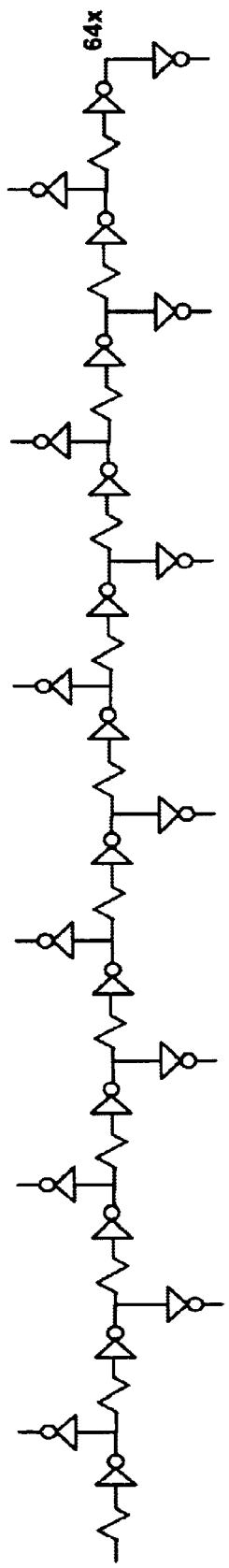
FIG. 3A is a diagram of an exemplary coarse delay element in accordance with one embodiment of the present invention for utilizing a delay lock loop to cover a wide delay range.

In addition to being received by global PC 205, the clock pulse is passed through MSB delay 220 which is utilized for performing a coarse adjustment to the initial delay (e.g., feedback clock 202 from chip delay 222). MSB delay 220 utilizes a programmable resistance RC as shown in FIG. 3A as a coarse delay adjustment element. In one embodiment, MSB delay may be a 64-bit row staggered as two 32-bit columns. Each stagger refers to a different MSB delay than the previous. Thus, each MSB delay can have an overlapping delay control range.

With reference still to FIG. 2, global control 290 passes the global PC 205 information to local control unit 210 and local control unit 280. In the present embodiment, both local control units are calculating a programmable delay for the reference clock pulse. However, for the purposes of clarity and brevity, local control unit 210 is described as being a portion of the master chain (e.g., A clock 203) while local control unit 280 is described as being a portion of the slave chain (e.g., B clock 204). As described above, it is alternately possible that local control unit 280 would be a portion of the master chain while local control unit 210 would be a portion of the slave chain.

The local control units calculate the desired delay and send the resulting calculations for adding or removing delay to the counters. In the master chain, local control 210 sends the desired delay calculations to counter 240. In the slave chain, local control 280 sends the desired delay calculations to counter 270. Once the counters receive the input from the local controls, the delay requirements are added to the original MSB delay 220 at MSB MUX 225 and MSB MUX 255. The resulting phase variation is then sent from the MSB MUXs to the LSB delays for fine-tuning.

Figure 3B:
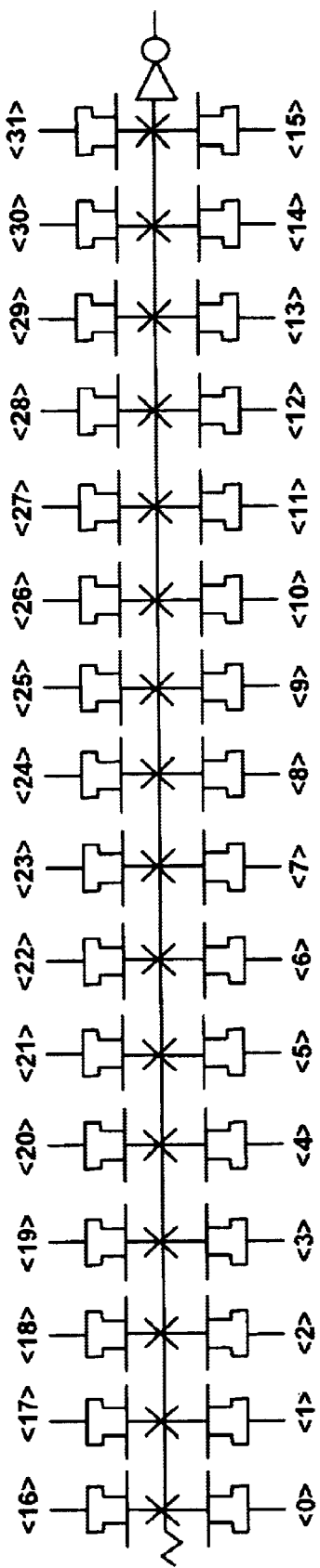
FIG. 3B is a diagram of an exemplary fine delay element in accordance with one embodiment of the present invention for utilizing a delay lock loop to cover a wide delay range.

For example, with reference now to the master chain, MSB MUX 225 receives the delay requirements from counter 240 and adds them to the original MSB delay 220. Additionally, LSB 230 receives further delay input from counter 245. Then LSB delay 230 fine-tunes the clock signal such that the feedback clock 202 signal is in phase with the reference clock pulse from reference clock 201 and any jitter and/or skip is minimized. LSB delay 260, of the slave chain, accomplishes the same goal of minimizing any jitter and/or skip. As shown in FIG. 3B, the LSB delays may be gate capacitance RC based fine delay adjustments with passgate design to select delay elements. The LSB delays may be switchable capacitors with fixed resistance and variable capacitance, or fixed capacitance and variable resistance, or variable resistance and variable capacitance, or any combination thereof.

With reference again to FIG. 2, the LSB delays feed the realigned signal to the local PCs (235, 265) and/or the output MUX 295. The corrected signal received from the master chain is output by MUX 295 as output data 299 while the corrected signal which may be received from the slave chain is stopped. The master local PC (e.g., local PC 235) and the slave local PC (e.g., local PC 265) receive the results from both LSB delay 230 and LSB delay 260 as well as global control 290. Each local PC then outputs their resulting calculations to the local controller within the specific chain. For example, local PC 235 outputs its resulting calculations to local control 210. Although two local PCs are shown, DLL 200 may operate with one or more local PCs. Two local PCs are shown in FIG. 2 merely for purposes of clarifying the master and slave chains.

The local PCs are the check and balance for the DLL of each chain. For example, when a local PC receives the results from both LSB delays, the results are compared to ensure that the slave chain is synchronized with the master chain. The importance of a synchronized output is due to the switching protocols (from master to slave and vice versa) described herein. Additionally, the local PC compares the LSB delay output signal (e.g., clock 203 and clock 204) due to a tertiary input from global control 290. The results of the comparisons are then fed to the local controller in order that any further corrections to the phase variations may be made.

The switching protocols (from master to slave, and slave to master) are maintained by global control 290. Initially one chain is specified as master and the other as slave. During the adjustment of the phase variations, the master chain LSB delay begins to near its adjusting limit. That is, the master chains LSB delay is reaching the bounds of its frequency adjusting range. At that time, global control 290 receives feedback from the master chain local control 210 warning that the counter for the master LSB delay is at its limit, and more delay is required. This warning results in global control 290 authorizing the switch.

During the switching process, the slave chain (e.g., B clock 204) must be in a locked (synchronized) state with the master chain (e.g., A clock 203). That is, the local PC will return information to the local control that the master chain and slave chain are synchronized. Furthermore, MUX 295 will time the output of output data 299 such that the transition of the master to slave, and slave to master, do not occur during a critical pulse time. For example, MUX 295 will switch the output signal between clock pulses or in a non-critical portion of the pulse.

Once the switch has occurred, the master chain (e.g., now B clock 204) continues to adjust the phase variations of the delay and reference clock pulse, while the slave chain (e.g., now A clock 203) is realigned in a new overlapping phase range and resynchronized with the master. Thus, when the next transitional period occurs, both the master and the slave are synchronized and ready to switch.

Figure 4:
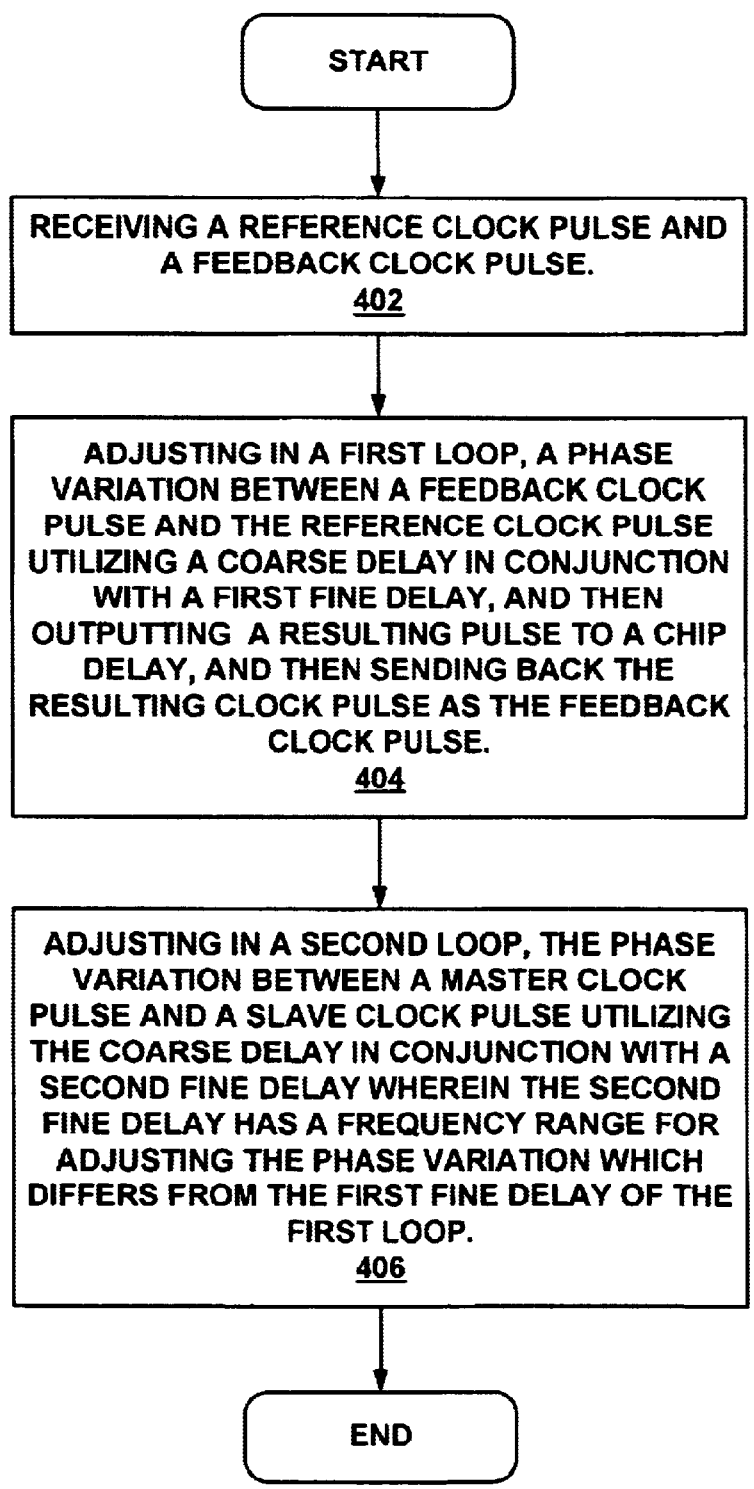
FIG. 4 is a flowchart of steps performed in accordance with an embodiment of the present invention for utilizing a delay lock loop to cover a wide delay range.

With reference now to FIG. 4, a flowchart 400 of the steps performed in accordance with an embodiment of the present invention for utilizing a delay lock loop to cover a wide delay range is shown.

With reference now to step 402 of FIG. 4, a delay lock loop receives a reference clock pulse and a feedback clock pulse. According to embodiments of the present invention, the delay lock loop includes two loops, one acting as a master loop (e.g., A clock 203), the other as a slave (e.g., B clock 204). Additionally, there is some sharing of components between the two loops. The sharing of components has the advantage of reducing cost, power consumption, and/or size. As stated herein, the reference clock pulse is received from a systemwide-clocking device used to keep the system organized.

With reference now to step 404 of FIG. 4, the first loop (e.g., the master loop) adjusts the phase variation between a feedback clock pulse and the reference clock pulse utilizing a coarse delay in conjunction with a first fine delay. For example, as shown in FIG. 2, the first loop may utilize local control 210, counters 240 and 245, MSB multiplexor (MUX) 225, and least significant bit (LSB) delay (first fine delay) 230, MUX 295, chip delay 222 to realign the phase of the feed back clock 202 with that of reference clock 201.

The resulting output clock 299 is then sent through a chip delay which results in a feedback clock pulse 202. For example, using the loop functioning as master as shown in FIG. 2, in one embodiment, the delay element may be chip delay 222. Furthermore, the delay may be caused by a user desired delay, an application desired delay, a component desired delay, or the like which desire a delay in order to keep the system organized. Additionally, the delay may be caused by the environment. For example, temperature changes, voltage changes, system noise, input clock jitter, and/or the like may cause a non-desired delay.

With reference now to step 406 of FIG. 4, the second loop (e.g., the slave chain) adjusts the phase variation between the master clock pulse (e.g., A clock 203) and the slave clock pulse (e.g., 204) utilizing the coarse delay in conjunction with a second fine delay. The second fine delay having a delay range for adjusting the phase variation which overlaps the delay range of the first fine delay of the first loop. For example, as shown in FIG. 2, the second loop may utilize local control 280, counters 270 and 275, MSB MUX 255, and LSB delay (second fine delay) 260 to realign the phase of the slave clock pulse (e.g., B clock 204) with that of the master clock pulse (e.g., A clock 203). As stated herein, at any point B clock 204 may become the master clock pulse and A clock 203 may become the slave clock pulse. It should be appreciated that the utilization of A clock 203 as the master and B clock 204 as the slave is merely for purposes of clarity.

Furthermore, as stated herein, the overlapping delay range of the first loop (e.g., master clock pulse A clock 203) and the second loop (e.g., slave clock pulse B clock 204) allow the second loop to take over the job of the first loop without the need for a reset. Thus, the entire DLL is able to provide a smooth transition when it steps from one LSB delay to the other. Additionally, there is no need for a user to push a reset button for the LSB delay that reaches its limit. This is due to the ability of the slave chain to reset itself without interrupting the output of the DLL. Furthermore, due to the utilization of a local slave chain within the DLL sharing the MSB delay, a reduction in both cost and power is realized.

Thus, the present invention provides, in various embodiments, a method and system for a high-resolution delay lock loop. The present invention further provides a method and system for a high-resolution delay lock loop which provides a smooth transition while stepping from one MSB delay to another. The present invention also provides a method and system for a high-resolution delay lock loop which minimizes jitter and skipping while covering a wide delay range with a fast lock time.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

What is claimed is:

1. A delay lock loop comprising:
    a coarse delay element;
    a first loop communicatively coupled with said coarse delay element, said first loop utilizing a coarse delay in conjunction with a first fine delay for adjusting a phase variation between a feedback clock pulse and a reference clock pulse; and
    a second loop communicatively coupled with said coarse delay element, said second loop utilizing said coarse delay in conjunction with a second fine delay for adjusting said phase variation between said second loop and said first loop, said second fine delay having a delay range for adjusting said phase variation which overlaps the delay range of said first fine delay of said first loop.

2. The delay lock loop of claim 1 wherein said first loop is initially a master chain and said second loop is initially a slave chain.

3. The delay lock loop of claim 2 wherein said master chain returns said feedback clock pulse to a local phase comparator (PC) and outputs said feedback clock pulse in phase with said reference clock pulse.

4. The delay lock loop of claim 2 wherein said slave chain returns said feedback clock pulse to a local phase comparator (PC).

5. The delay lock loop of claim 2 wherein said second loop becomes a master chain and said first loop becomes a slave chain when said delay range of said phase variation passes beyond said delay range of said first fine delay of said first loop.

6. The delay lock loop of claim 5 wherein said master chain returns said feedback clock pulse to a local phase comparator (PC) and outputs said feedback clock pulse in phase with said reference clock pulse.

7. The delay lock loop of claim 5 wherein said slave chain returns said feedback clock pulse to a local phase comparator (PC).

8. A method for utilizing a delay lock loop to cover wide delay ranges comprising:

receiving a reference clock pulse and a feedback clock pulse;

adjusting in a first loop, a phase variation between said feedback clock pulse and said reference clock pulse utilizing a coarse delay in conjunction with a first fine delay; and adjusting in a second loop, said phase variation between said first loop and said second loop utilizing said coarse delay in conjunction with a second fine delay, said second fine delay having a delay range for adjusting said phase variation which overlaps the delay range of said first fine delay of said first loop.

9. The method as recited in claim 8 wherein said first loop is initially a master chain and said second loop is initially a slave chain.

10. The method as recited in claim 9 further comprising:

returning said feedback clock pulse from said master chain to a local phase comparator (PC); and outputting said feedback clock pulse in phase with said reference clock pulse.

11. The method as recited in claim 9 further comprising:

returning said feedback clock pulse from said slave chain to a local phase comparator (PC); and resetting said feedback clock pulse from said slave chain without interrupting the output of said delay lock loop.

12. The method as recited in claim 9 further comprising:

said second loop becoming a master chain and said first loop becoming a slave chain when said phase variation passes beyond said delay range of said first fine delay of said first loop.

13. The method as recited in claim 12 further comprising:

returning said feedback clock pulse from said master chain to a local phase comparator (PC): and outputting said feedback clock pulse in phase with said reference clock pulse.

14. The method as recited in claim 12 further comprising:

returning said feedback clock pulse from said slave chain to a local phase comparator (PC).

15. A method for utilizing a delay lock loop to cover wide delay ranges comprising:

receiving a reference clock pulse and a feedback clock pulse;

adjusting in a first loop, a phase variation between a feedback clock pulse and said reference clock pulse utilizing a coarse delay in conjunction with a first fine delay;

returning a corrected clock pulse to a local phase comparator (PC);

adjusting in a second loop, said phase variation between a first clock pulse in said first loop and a second clock pulse in said second loop utilizing said coarse delay in conjunction with a second fine delay, said second fine delay having a delay range for adjusting said phase variation which overlaps the delay range of said first fine delay of said first loop; and returning a corrected clock pulse to a local phase comparator (PC).

16. The method as recited in claim 15 further comprising:

initiating said first loop as a master chain and said second loop as a slave chain.

17. The method as recited in claim 16 further comprising:

outputting said feedback clock pulse from said master chain in phase with said reference clock pulse.

18. The method as recited in claim 16 further comprising:

said second loop becoming a master chain and said first loop becoming a slave chain when said phase variation passes beyond said delay range of said fine delay of said first loop.

19. The method as recited in claim 18 further comprising:

outputting a corrected first clock pulse from said master chain in phase with said reference clock pulse.

20. The method as recited in claim 18 further comprising:

switching from said first loop as master to said second loop as master resulting in a delay lock loop which can cover a wide delay range with a high resolution.

* * * * *